United States Patent [19]
Akiyama

[11] Patent Number: 5,600,251
[45] Date of Patent: Feb. 4, 1997

[54] SURFACE ELECTRIC POTENTIAL SENSOR DRIVE AND INDUCTION NOISE CANCELLATION CIRCUIT

[75] Inventor: Osamu Akiyama, Tokyo, Japan

[73] Assignee: NEC Corporation, Tokyo, Japan

[21] Appl. No.: 398,997

[22] Filed: Mar. 6, 1995

[30] Foreign Application Priority Data

Mar. 7, 1994 [JP] Japan ................................. 6-036167

[51] Int. Cl.⁶ .............................. G01R 29/12; G01R 5/28
[52] U.S. Cl. ......................... 324/613; 324/457; 324/458; 324/72
[58] Field of Search ..................... 324/452, 457, 324/458, 613, 614, 72

[56] References Cited

U.S. PATENT DOCUMENTS

| | | | |
|---|---|---|---|
| 4,613,228 | 9/1986 | Suzuki et al. | 324/457 X |
| 4,649,336 | 3/1987 | Bindner et al. | 324/458 x |
| 4,683,436 | 7/1987 | Suzuki | 324/458 |
| 4,720,682 | 1/1988 | Ikushima et al. | 324/457 X |
| 4,724,393 | 2/1988 | Kumada et al. | 324/458 |
| 4,853,639 | 8/1989 | Vosteen et al. | 324/457 |

FOREIGN PATENT DOCUMENTS

| | | | |
|---|---|---|---|
| 118267 | 5/1987 | Japan | 324/457 |
| 110167 | 5/1987 | Japan | 324/457 |

*Primary Examiner*—Maura K. Regan
*Assistant Examiner*—Diep Do
*Attorney, Agent, or Firm*—Young & Thompson

[57] ABSTRACT

Surface potential is detected with high precision by removing induction noise generated by a drive circuit and transmitted to a detection electrode. Induction noise imparted by a drive circuit to an A.C. voltage signal is cancelled out by supplying an output of a pre-amplifier for amplifying the A.C. voltage signal derived from a detection electrode and an output of the drive circuit for applying a drive signal to a chopper portion to a differential amplifier and differentially amplifying them. Particularly, an attenuator for making a level of the amplified A.C. voltage signal substantially coincident with a level of a signal from the drive circuit and an inverter/amplifier for making phase deviation coincident are provided in an output portion of the pre-amplifier circuit.

16 Claims, 4 Drawing Sheets

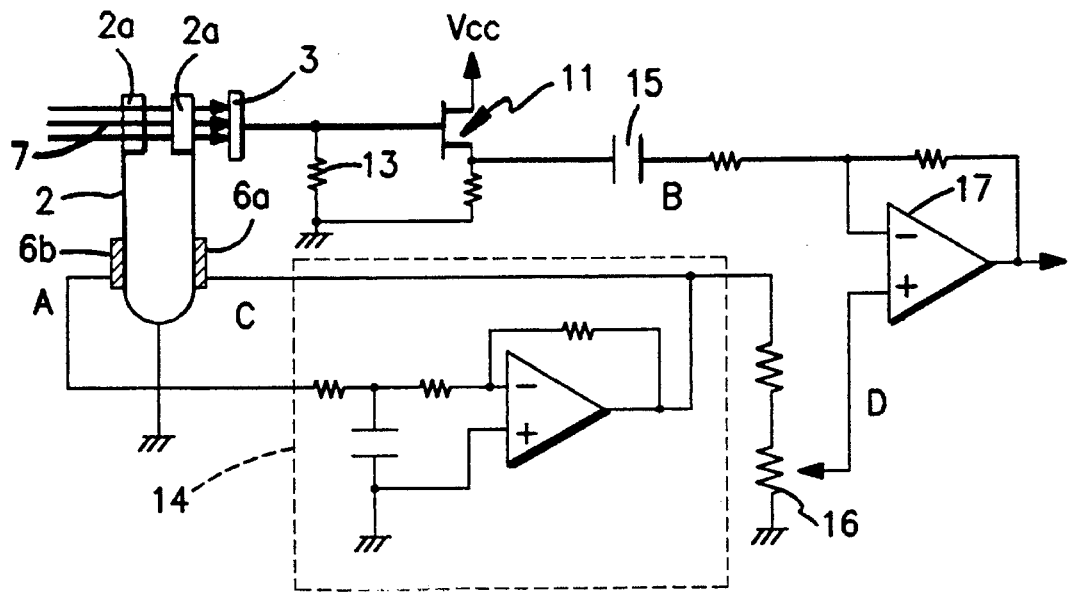
FIG. 4
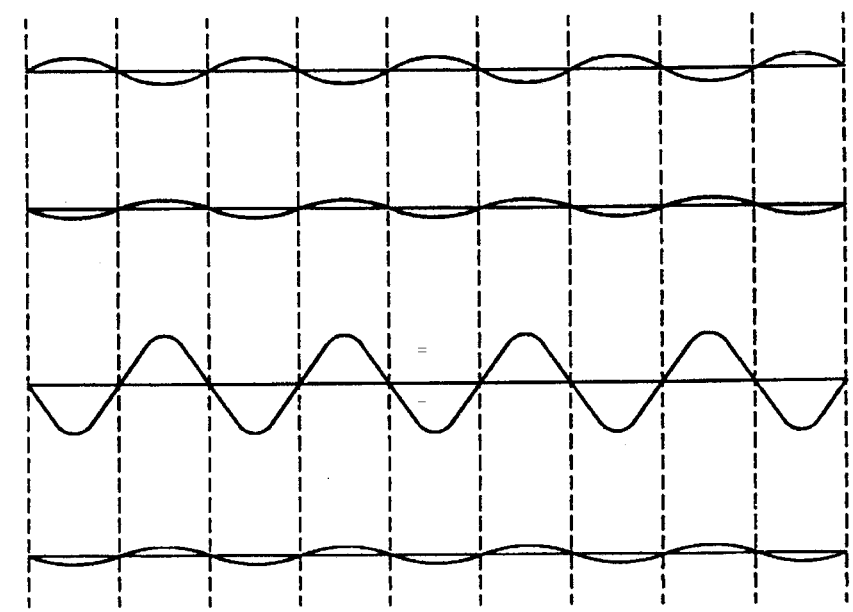
FIG. 5A
FIG. 5B
FIG. 5C
FIG. 5D

SURFACE ELECTRIC POTENTIAL SENSOR DRIVE AND INDUCTION NOISE CANCELLATION CIRCUIT

BACKGROUND OF THE INVENTION

1. Field of the Invention

The present invention relates to a surface potential sensor and, more particularly, to the construction of a processing circuit for processing an electric signal from a fork of a surface potential sensor.

2. Description of Related Art

In general, a surface potential sensor is constructed with a chopper portion for chopping electric lines of force emitted from an objective to be measured at a constant frequency, an electrode for deriving the electric lines of force chopped by the chopper portion as an A.C. signal and a pre-amplifier for amplifying this A.C. signal and converting this impedance. A device of this type is described in Japanese Patent Appln. Laid-Open No. S60-231176.

In use of the surface potential sensor constructed as mentioned above, an externally provided fork oscillator circuit is connected between the fork driving terminal and the detecting terminal so that the fork is driven at a resonance frequency.

In conventional surface potential sensors, noise is induced in the detection electrode through a space of the sensor due to a signal supplied to the driving and detecting terminals. Since the detection electrode is kept at high impedance in order to allow it to pick up and amplify a very low amplitude signal, it is sensitive to noise from the driving and detecting terminals. Such noise may become an offset output of the surface potential sensor and, therefore, an A.C. voltage signal is detected, even when the electric lines of force are cut and the measured voltage should be 0V.

Since the offset output has a frequency component equal to that of the detection signal, it is impossible to remove the offset even if a frequency filter circuit is added. Also, there is a deviation between input/output characteristics when a low voltage measurement is performed and, it makes an accurate measurement difficult.

SUMMARY OF THE INVENTION

In view of the problems mentioned above, the object of the invention is to provide a surface potential sensor capable of detecting a surface potential with high precision by removing induction noise induced by the drive circuit in the detection electrode.

In order to solve the problems mentioned above, the surface potential sensor according to the present invention comprises a chopper portion for cutting the electric lines of force emitted from an objective to be measured at a constant frequency, a detection circuit for receiving electric lines of force chopped by the chopper portion and outputting an A.C. voltage signal, a pre-amplifier circuit connected to the detection electrode for amplifying the A.C. voltage signal and outputting an amplified A.C. voltage signal and a drive circuit for applying a drive signal to a drive electrode of the chopper portion to oscillate the chopper portion. The invention is especially characterized by an induction noise removing circuit between the driving circuit and the preamplifier circuit for removing induction noise overlapped on the A.C. voltage signal from the drive signal.

More particularly, in the above-mentioned construction, the chopper portion may be a fork or reed type vibrator vibrating in parallel to the electric lines of force and the detection electrode is preferably fixed to a vibrating portion of the vibrator through an insulator.

Also, the present invention is characterized in that the induction noise removing circuit is preferably a differential amplifier circuit supplied with an amplified A.C. voltage signal and the drive signal as its input signals.

In addition to the above-mentioned construction, the invention is characterized by further comprising an amplified A.C. voltage signal regulation circuit provided between the output side of the pre-amplifier circuit and the induction noise removing circuit, for regulating the amplitude of the amplified A.C. voltage signal such that it becomes substantially equal to the amplitude of the drive signal.

The device according to the invention preferably also includes an amplified A.C. voltage signal phase regulation circuit provided between the output side of the amplifier circuit and the induction noise removing means, for regulating the phase of the amplified A.C. voltage signal such that it is inverted with respect to the phase of the drive signals.

The amplified A.C. voltage signal regulation circuit and the amplified A.C. voltage signal phase regulation circuit can be embodied as an attenuator and an inverter/amplifier, respectively.

In the surface potential sensor according to the present invention, an output of the pre-amplifier circuit for amplifying the A.C. voltage signal derived from the detection electrode and an output of the drive circuit for supplying the drive signal to the chopper portion are inputted to the differential amplifier. Then, the induction noise overlapped on the A.C. voltage signal from the drive circuit is cancelled out by the differential amplifier.

In this arrangement, the attenuator is provided in an output portion of the pre-amplifier circuit such that the level of the amplified a.C. voltage signal is substantially coincident with the level of the signal from the drive circuit. When there is a phase difference, the inverter/ amplifier is provided to make the phases coincident. With this construction, the induction noise from the drive circuit which is overlapped on the A.C. voltage signal output from the pre-amplifier circuit is effectively removed, so that a high precision measurement becomes possible.

BRIEF DESCRIPTION OF THE DRAWINGS

The above and other objects, features and advantages of the present invention will become more apparent from the following detailed description when taken in conjunction with the accompanying drawings wherein:

FIG. 4 is a circuit diagram showing a first embodiment of a surface potential sensor according to the present invention;

FIG. 5 is a timing chart explaining the operation of the embodiment of FIG. 4;

DETAILED DESCRIPTION OF THE PREFERRED EMBODIMENTS

Figure 1:
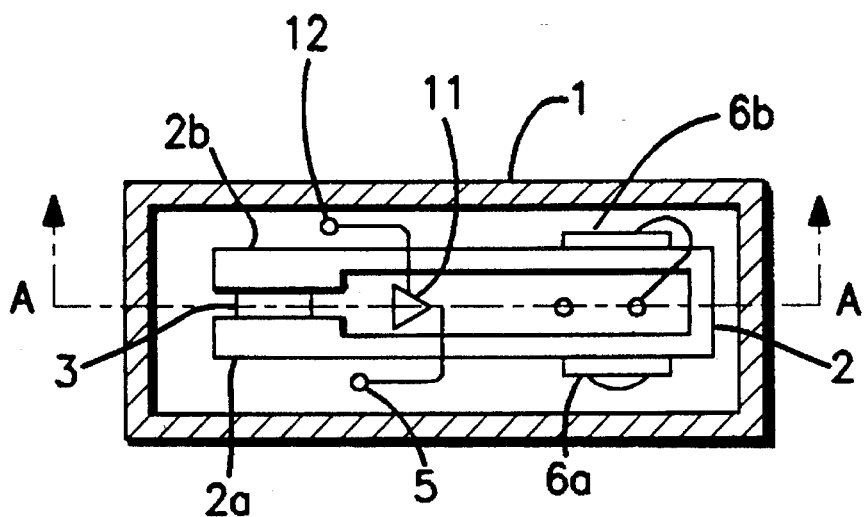
FIG. 1 is a partly-sectioned plan view showing an example of a conventional potential sensor.
Figure 2:
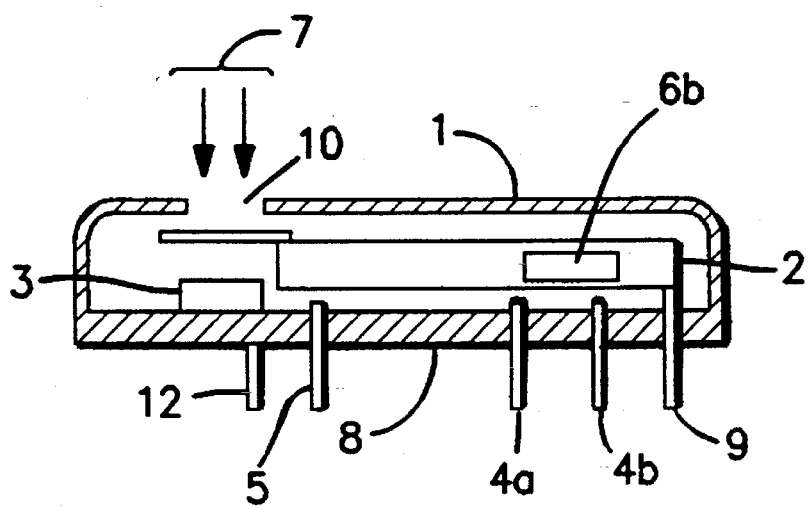
FIG. 2 is a partly-sectioned side view taken along the line A—A of FIG. 1.

To begin with, to easily understand the present invention, the conventional surface potential sensor will be briefly explained. FIGS. 1 and 2 show a partly-sectioned structure of a conventional surface potential sensor in plan view and in side view, respectively. Piezo-electric ceramics 6a and 6b for driving and detecting, respectively, are attached to the opposite legs of a fork 2 and the electric lines of force 7 are chopped at a constant frequency by chopper portions 2a formed on top end portions of the legs. A detection electrode 3 and the fork 2 are fixed on a base plate 8 on which a pre-amplifier circuit 11 is provided. The base plate 8 is housed in a casing 1 having a detection hole 10 for admitting the electric lines of force 7 interiorly of the casing. The base plate 8 is provided at predetermined positions thereof with a fork driving terminal 4a, a fork detecting terminal 4b, an output terminal 5, a power source terminal 12 for the pre-amplifier and a grounding terminal 9. Internal wiring are provided between the fork driving terminal 4a and the detecting terminal 4b and between the driving ceramic 6a and the detecting ceramic 6b.

In use of the surface potential sensor constructed as above, an externally provided fork oscillator circuit is connected between the fork driving terminal 4a and the detecting terminal 4b so that the fork is driven at a resonance frequency.

In the conventional surface potential sensor, noise is induced in the detection electrode 3 through the space of the sensor due to a signal supplied to the driving piezo-electric ceramic 6a and the detecting piezo-electric ceramic 6b. This noise prevents the sensor from producing a high precision measurement.

Since the detection electrode 3 is kept at high impedance in order to allow it to pick up and amplify a very low amplitude signal, it is sensitive to noise from the piezo-electric ceramics 6a and 6b. Such noise may become an offset output of the surface potential sensor and, therefore, an A.C. voltage signal is detected, even when the electric lines of force are cut and the measured voltage should be 0V.

Figure 3:
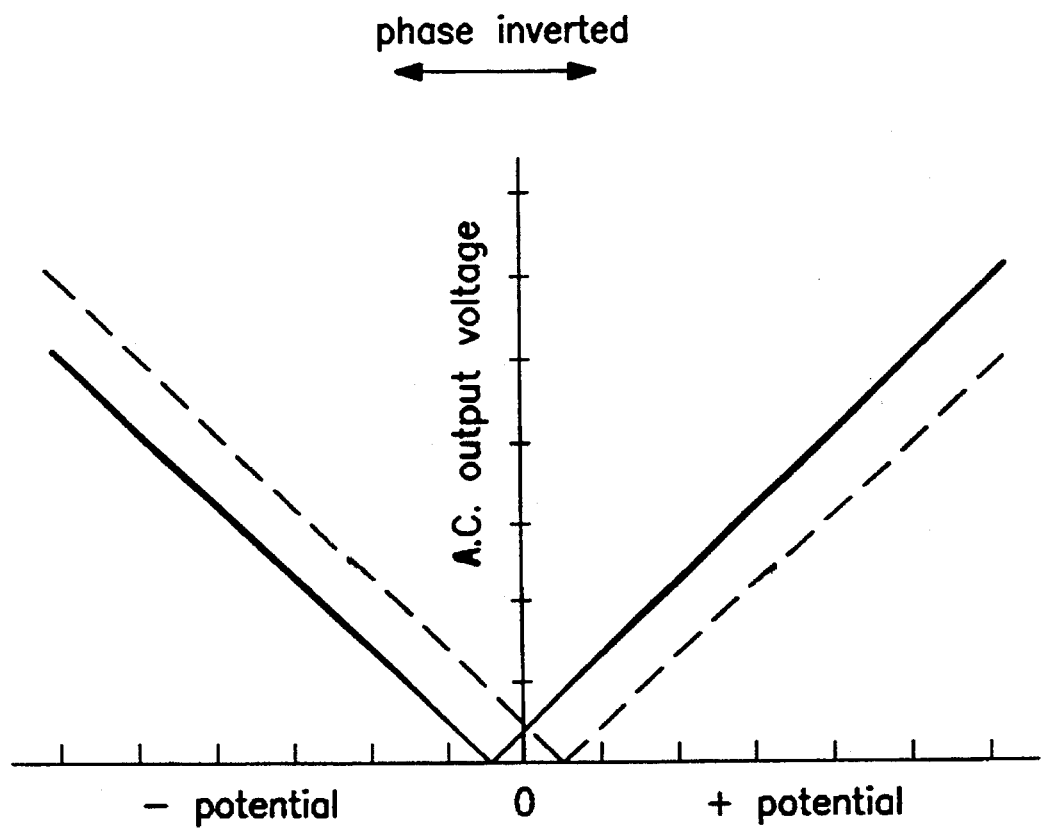
FIG. 3 is a diagram showing operational characteristics of the conventional potential sensor.

As also noted above, since the offset output has a frequency component equal to that of the detection signal, it is impossible to remove the offset output even by using a frequency filter circuit. Further, as shown in FIG. 3, there is a deviation between input/output characteristics when a low voltage measurement is performed and, therefore, it makes an accurate measurement difficult. In addition, in a case where a high voltage feedback type potential measurement is performed, the input/output characteristics reduce the preciseness of measurement due to the offset output since potentials of the objective to be measured and the sensor are required to keep zero level.

Now, the present invention will be described in detail with reference to the drawings. FIG. 4 shows a fork portion and a processing circuit of a surface potential sensor according to a first embodiment of the present invention. The surface potential sensor according to the present invention comprises a fork 2 having a chopper portion 2a for chopping electric lines of force, a base plate on which a detection electrode 3 and a pre-amplifier circuit 11 are mounted, a drive circuit 14 for driving the fork 2, an attenuator circuit 16 and a differential amplifier circuit 17, all of which are housed in a casing (not illustrated). The case has a detection hole in the vicinity of the chopper portion 2a of the fork 2, for admitting electric lines of force from an externally disposed objective to be measured. The surface potential sensor of this embodiment is similar to the conventional sensor as shown in FIG. 1 except an outer configuration thereof and the signal processing circuit is also incorporated in the casing.

The surface potential sensor of this embodiment has the fork 2 as the chopper for chopping electric lines of force. The fork 2 is provided with a chopper portion 2a for chopping electric lines of force extending from the external objective to be measured at a constant frequency, and piezo-electric ceramics 6a and 6b for exciting the fork 2 via a drive signal. Electric lines of force 7 passing through the chopper portion 2a encounter the detection electrode 3 where they are detected as an A.C. voltage signal which is amplified by the preamplifier circuit 11. On the other hand, the piezo-electric ceramics 6a and 6b fixed on both sides of the fork 2 are supplied with the drive signal from the drive circuit 14 so that the fork 2 is excited thereby.

In the present invention, in addition thereto, a differential amplifier 17 is provided in order to remove induction noise imparted to the detected A.C. voltage signal by the drive signal. In particular, an output of the drive circuit 14 and an output of the pre-amplifier circuit 11 are respectively connected to the positive and negative input terminals of the differential amplifier 17. An attenuator circuit 16 is provided between the drive circuit 14 and the differential amplifier 17, for attenuating the level of the drive signal from the drive circuit 14 such that it becomes substantially equal to the level of the amplified A.C. voltage signal from the pre-amplifier circuit 11.

The operation of the surface potential sensor of this embodiment will now be described.

The voltages at points A, B, C and D in FIG. 4 when there are no electric lines of force, that is, when the measured voltage should be 0V, are shown in FIG. 5. The fork 2 is driven by the drive circuit 14 and vibrates at a frequency specific thereto. In this case, induction noise having a frequency equal to the drive frequency is generated on the detection electrode 3 by voltage and current applied to the ceramics 6a and 6b. A signal containing the induction noise is impedance-converted converted by the pre-amplifier circuit 11 and then a D.C. component thereof is removed by a capacitor 15, resulting in the signal B.

On the other hand, the drive signal of the fork 2 is amplitude-regulated by the attenuator circuit 16, resulting in a signal D. The signals B and D are input respectively to the negative and positive input terminals of the differential amplifier circuit 17, and compared with each other. In this case, if the phase and amplitude of the signal D are equal to those of the signal B, the induction noise component is completely cancelled out. The output from differential amplifier circuit 17 is then exactly 0V. In a case where the phase/amplitude of the signal B differs from that of the signal D, an inverter/amplifier may be connected as appropriate to an output side of the drive circuit 14.

When electric lines of force enter the casing, that is, when the objective to be measured is charged to a certain potential, induction noise can also be removed by the differential amplifier circuit 17 in the same way as mentioned above. In this case, since the offset voltage is 0, the linearity in a low voltage measurement is substantially improved in both positive potential and negative potential. As a result, the accuracy of the high voltage feedback measuring system is improved.

In order to reduce the offset voltage, the signal B or the output of the differential amplifier circuit 17 may be passed through a band-pass filter or the signal D may be passed through a phase shifter circuit.

Now, a second embodiment of the surface potential sensor according to the present invention will be described.

Figure 6:
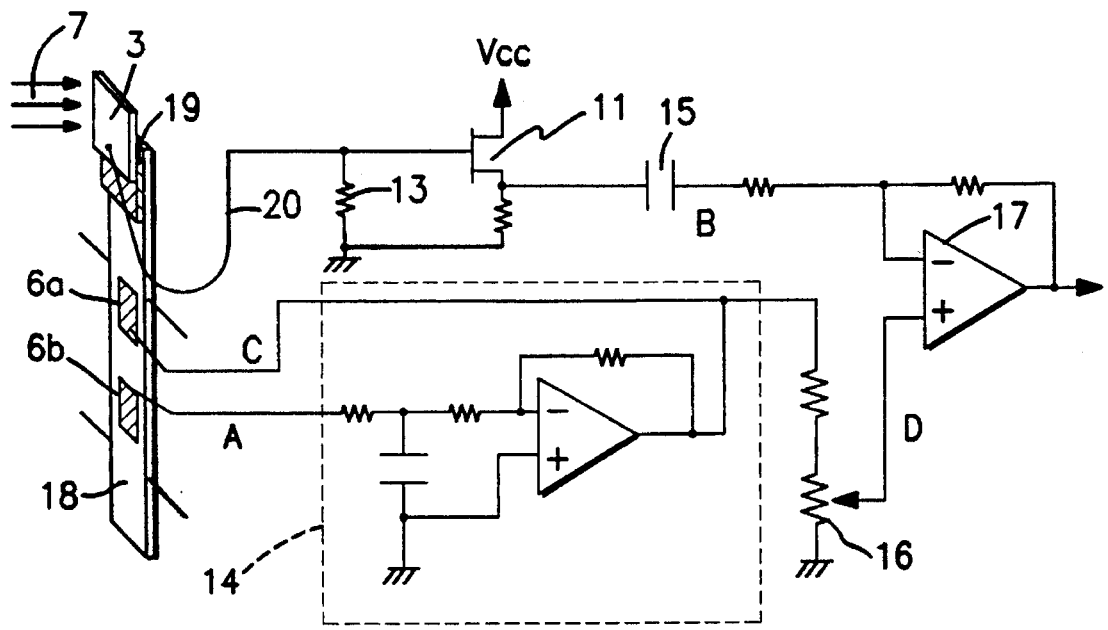
FIG. 6 is a circuit diagram showing a second embodiment of a surface potential sensor according to the present invention.

As shown in FIG. 6, the second embodiment uses a reed vibrator 18 integrated with a detection electrode 3 via an insulator 19, instead of the fork 2 and the detection electrode 3 of the first embodiment shown in FIG. 4. This embodiment has a structure in which the reed vibrator 18 vibrates in parallel to the electric lines of force 7.

Use of a reed vibrator provides an advantage in that, since the detection electrode itself vibrates, accumulation of dust to the detection electrode is minimized and hence measurement distortion on that account hardly occurs. However, the wiring length from the detection electrode to the succeeding circuit is increased and the influence of the drive circuit becomes more pronounced compared with the first embodiment, resulting in further increased induction noise.

However, the processing circuit of the present invention used in the first embodiment is also applicable to the reed-type surface potential sensor, thereby to substantially eliminate the offset voltage. Although the reed vibrator is shown in FIG. 6 as an example, the same effect can be obtained by using a fork having one leg used as an electrode.

Figure 7:
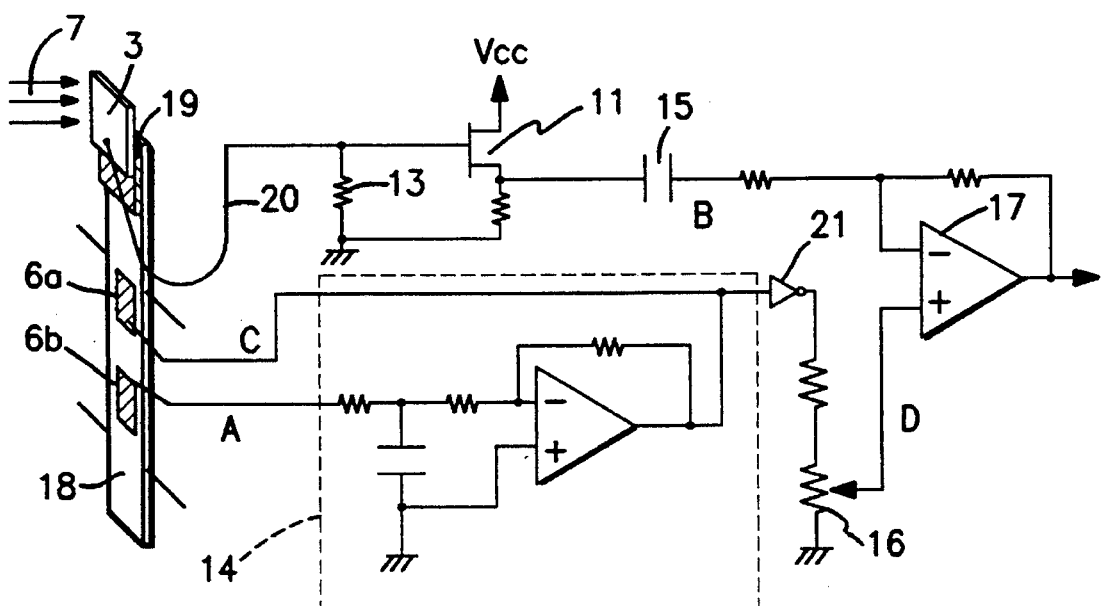
FIG. 7 is a circuit diagram showing a third embodiment of a surface potential sensor according to the present invention.

FIG. 7 is a circuit diagram showing a third embodiment of a surface potential sensor according to the present invention. This circuit is almost the same as the circuit shown in FIG. 6 except that an inverter/amplifier 21 is provided at the output of the driving circuit 14. The inverter/amplifier 21 is necessary in case of a phase difference, and functions to regulate the phase of the amplified A.C. voltage signal such that it is inverted with respect to the phase of the drive signal.

As described hereinbefore, the surface potential sensor according to the present invention substantially reduces induction noise generated by the drive signal for driving the fork and contained in the A.C. voltage signal detected by the detection electrode, by processing the detected signal in the differential amplifier circuit.

Particularly, it becomes possible to make the output signal of the surface potential sensor exactly 0 when the measured voltage in the absence of electrode lines of force should be 0V. Also, it is possible to improve the accuracy of measured values in measuring low potentials and in performing a measurement of high voltage feedback system and to improve linearity of input/output measured values.

I claim:

1. A surface potential sensor, comprising:

a chopper portion for cutting electric lines of force radiated from a component to be measured, said chopper portion cutting the electric lines of force at a know frequency;

a detection electrode for detecting said cut electric lines of force and for outputting an A.C. voltage signal;

a pre-amplifier circuit connected to said detection electrode for amplifying the A.C. voltage signal and outputting an amplified A.C. voltage signal;

a drive circuit for applying a drive signal to a drive electrode of said chopper portion to oscillate said chopper portion; and induction noise removing means for removing induction noise imparted by the drive signal from the amplified A.C. signal, said induction noise removing means comprising a differential amplifier circuit for amplifying a difference between the amplified A.C. voltage signal and the drive signal, and outputting an amplified difference signal.

2. The surface potential sensor as claimed in claim 1, further comprising drive signal attenuation means provided between said drive circuit and said induction noise removing means, for causing an amplitude of the drive signal to become substantially equal to an amplitude of the amplified A.C. voltage signal.

3. The surface potential sensor as claimed in claim 2, wherein said amplified A.C. voltage signal phase attenuation means comprises an attenuator.

4. The surface potential sensor as claimed in claim 1, further comprising D.C. component removing means provided between said pre-amplifier circuit and said induction noise removing means, for removing a D.C. component from the amplified A.C. voltage signal output from said pre-amplifier circuit.

5. The surface potential sensor as claimed in claim 1, further comprising drive signal phase inverting means provided between an output side of said drive circuit and said induction noise removing means, for inverting a phase of the amplified A.C. voltage signal relative to a phase of the drive signal.

6. The surface potential sensor as claimed in claim 5, wherein said amplified A.C. voltage signal phase regulation means comprises an inverter/amplifier circuit.

7. The surface potential sensor as claimed in claim 1, wherein the A.C. voltage signal is an output of a fork on which said chopper portion for chopping electric lines of force at a constant frequency is mounted, said chopper portion vibrating in parallel to the electric lines of force.

8. The surface potential sensor as claimed in claim 1, wherein said drive electrode includes a piezo-electric ceramic.

9. A surface potential sensor, comprising:

a detection electrode for receiving electric lines of force emitted from a component to be measured and outputting an A.C. voltage signal;

a reed vibrator connected to said detection electrode through an insulator and vibrating in parallel to the electric lines of force;

a pre-amplifier circuit connected to said detection electrode for amplifying the A.C. voltage signal and sending an amplified A.C. voltage signal;

a drive circuit for vibrating said reed vibrator by applying a drive signal to a drive electrode of said reed vibrator; and induction noise removing means for removing induction noise imparted to the A.C. voltage signal by the drive signal, said induction noise removing means comprising a differential amplifier circuit receiving the amplified A.C. voltage signal and the drive signal as it inputs, amplifying a difference between said signals, and outputting an amplified difference signal.

10. The surface potential sensor as claimed in claim 9, further comprising drive signal attenuation means provided between said drive circuit and said induction noise removing means, for causing an amplitude of the amplified A.C. voltage signal to become substantially equal to an amplitude of the drive signal.

11. The surface potential sensor as claimed in claim 9, further comprising amplified A.C. voltage signal phase inverting means provided between an output side of said drive circuit and said induction noise removing means, for inverting a phase of the drive signal with respect to a phase of the A.C. voltage signal.

12. The surface potential sensor as claimed in claim 11, wherein said amplified A.C. voltage signal attenuation means comprises an attenuator.

13. The surface potential sensor as claimed in claim 11, wherein said amplified A.C. voltage signal phase inverting means comprises an inverter/amplifier circuit.

14. The surface potential sensor as claimed in claim 9, further comprising D.C. component removing means provided between said pre-amplifier circuit and said induction noise removing means, for removing a D.C. component from the amplified A.C. voltage signal output from said pre-amplifier.

15. The surface potential sensor as claimed in claim 9, wherein the A.C. voltage signal is an output of a fork on which said chopper portion vibration in parallel to the electric lines of force for chopping the electric line of force at a constant frequency is mounted.

16. The surface potential sensor as claimed in claim 9, wherein said drive electrode includes a piezo-electric ceramic.

\* \* \* \* \*